United States Patent
Kerns et al.

(10) Patent No.: US 8,060,355 B2
(45) Date of Patent: Nov. 15, 2011

(54) AUTOMATIC, HIERARCHY-INDEPENDENT PARTITIONING METHOD FOR TRANSISTOR-LEVEL CIRCUIT SIMULATION

(75) Inventors: Kevin J. Kerns, San Jose, CA (US); Mayukh Bhattacharya, Fremont, CA (US); Svetlana Rudnaya, San Jose, CA (US); Kiran Gullapalli, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 745 days.

(21) Appl. No.: 11/829,844

(22) Filed: Jul. 27, 2007

(65) Prior Publication Data

US 2009/0030665 A1 Jan. 29, 2009

(51) Int. Cl.
*G06F 17/50* (2006.01)
(52) U.S. Cl. ............................... 703/14; 716/1
(58) Field of Classification Search .................... 703/13, 703/14; 716/1, 7
See application file for complete search history.

(56) References Cited

U.S. PATENT DOCUMENTS

| | | | |
|---|---|---|---|
| 5,379,231 A * | 1/1995 | Pillage et al. | 703/14 |
| 6,577,992 B1 | 6/2003 | Deng et al. | |
| 6,807,520 B1 | 10/2004 | Zhou et al. | |
| 7,555,733 B1 * | 6/2009 | Gee et al. | 716/1 |
| 2004/0044510 A1 * | 3/2004 | Zolotov et al. | 703/14 |

* cited by examiner

*Primary Examiner* — Paul Rodriguez
*Assistant Examiner* — Andre Pierre Louis
(74) *Attorney, Agent, or Firm* — Bever, Hoffman & Harms, LLP; Jeanette S. Harms

(57) ABSTRACT

A method of providing simulation results includes detecting any power net and rail in a circuit netlist. The circuit can be divided into net-partitioned blocks. Using these net-partitioned blocks, a topological analysis can be performed to identify cuttable/un-cuttable devices and synchronization requirements. Then, the circuit can be re-divided into rail-partitioned blocks. Using these rail-partitioned blocks, a sparse solver can identify potential partitions, but eliminate fill-ins as determined by the topological analysis. A cost function can be applied to the potential partitions as well as the identified cuttable/un-cuttable devices to determine final cut points in the circuit and dynamic inputs to the final blocks. Simulation can be performed on the final blocks and simulation results can be generated.

7 Claims, 6 Drawing Sheets

100

AUTOMATIC, HIERARCHY-INDEPENDENT PARTITIONING METHOD FOR TRANSISTOR-LEVEL CIRCUIT SIMULATION

BACKGROUND OF THE INVENTION

1. Field of the Invention

The present invention relates to circuit simulation and in particular to an automatic, hierarchy-independent partitioning method for transistor-level circuit simulation.

2. Discussion of Related Art

A current very-large-scale integrated (VLSI) circuit may include several million transistors and other devices. Because of its large size and inherent complexity, verification of VLSI circuit operation prior to manufacture is important to minimize manufacturing cost. Computer simulation, which takes into account accurate device models, can be used in this verification.

One simulation technique called SPICE (Simulation Program with Integrated Circuit Emphasis) translates a netlist describing the circuit elements and their connections into equations to be solved. These equations (typically non-linear, differential-algebraic equations) can be solved using sparse matrix techniques.

Conventional SPICE simulations of VLSI circuits can undesirably exhibit a non-linearity when the size of the circuit design increases. For example, when a VLSI circuit design is doubled in size, the SPICE simulation of that larger circuit design can take more than twice as long and use more than twice as much memory as the original circuit design. Thus, simulation of a full VLSI circuit by using conventional techniques can be prohibitively expensive even on the latest computers due to time and memory constraints.

For these reasons, other simulation techniques use partitioning to decouple electrically weakly-connected circuit components to form circuit blocks and then simulate such circuit blocks independently. This partitioning reduces circuit complexity, which can have significant time savings (due to facilitating parallel processing) and minimize memory requirements.

For a reasonably simple design with an ideal power supply, this "divide-and-conquer" approach can yield dramatic simulation performance and memory improvements with an acceptable loss of accuracy. However, for a large number of advanced technology circuits (e.g. flash memory or other designs having non-rail bulk, low power circuits designed with switched or otherwise controlled power supplies, CMOS imager circuits, phase-locked-loops with charge-pump filters, and any other design having some form of non-ideal or internal power supply), the ability to partition without incurring loss of accuracy is minimized. Thus, simulation technology with partitioning of weakly-connected circuit components is slow, inaccurate, and/or frequently runs short of available computer memory.

In yet another simulation technique called Fast-SPICE, a trade-off of accuracy and performance is set in simulating large circuits. Typically, Fast-SPICE can run much faster than SPICE by partitioning a netlist of the VLSI circuit based on strong feed-forward (a pre-calibrated cause/effect) or feedback (an output used as a dynamic control input) but not both. For example, the voltage of an ideal power supply (e.g. an external voltage source) is independent of the current drawn and therefore exhibits a strong feed-forward. As a result, Fast-SPICE can partition all devices directly connected to that ideal power supply across their power supply nodes. In addition, the voltage/timing of a digital gate is weakly dependent on the current into a MOSFET gate if the gate capacitance is attached to the driver and therefore also exhibits a strong feed-forward. As a result, Fast-SPICE can place the load of the gate of such a device in a "driver block", thereby allowing the "driven block" to effectively see an ideal MOSFET in which the gate is replaced by an input voltage.

Fast-SPICE partitioning produces clusters of devices that are electrically decoupled so that they can be simulated separately and asynchronously. Unfortunately, in a design having a non-ideal (e.g. internal) power supply, partitioning by low-impedance paths (also called partitioning by strongly-connected blocks or channel-connected blocks) often leads to very large partition sizes. Specifically, because the non-ideal power source voltages are affected by the current load from the circuits they drive, these circuits and the non-ideal power source voltages need to be solved as one system.

State-of-the-art technologies that attempt to partition large circuits with non-ideal power supplies have two major drawbacks. First, these technologies frequently need input from engineers to designate the "cut points" (nodes at which to partition). Second, these technologies require a synchronous evaluation of all the resulting sub-partitions (also called blocks herein). That is, all blocks whether synchronous or asynchronous (i.e. event-driven) must be evaluated in synchronous steps. For example, when one block is running fast, all blocks must be evaluated at small steps (to ensure accurate simulation of the block that runs fast), thereby resulting in a dramatic slowing of simulation time. Thus, even though such partitioning can enable the simulation of huge circuits having non-ideal power supplies without running out of memory, the synchronous simulation requirement prevents taking advantage of latency and hinders fast simulation. Moreover, accuracy can degrade if the netlist is over simplified and the effects of critical circuit components are ignored. Yet further, improper cuts can cause the simulation to run slowly, inaccurately, or both slowly and inaccurately.

Therefore, a need arises for a fast and accurate technique that can automatically partition a VLSI circuit including a non-ideal voltage supply, thereby allowing the resulting blocks to be asynchronously simulated.

SUMMARY OF THE INVENTION

Many circuits include a non-ideal voltage source. Partitioning these circuits using conventional techniques can result in very large partition sizes, and hence long simulation times. Some techniques that can provide further partitioning require engineers or other technicians to manually partition the circuits, which can result in inconsistent partitioning. Moreover, even when successfully partitioned, the resulting blocks must be synchronously evaluated, thereby negating, at least in part, the advantages of partitioning.

In accordance with one aspect of the invention, even strongly-connected blocks can be partitioned. When partitioned, each driver block looks like an ideal voltage source to a load block. If the driver looks like an ideal voltage source, then all blocks connected to that voltage source can be simulated independently and asynchronously. Notably, simulating blocks of a large circuit asynchronously can be performed orders of magnitude faster than simulating those blocks synchronously.

In one embodiment for providing simulation results, a netlist of a circuit can first be parsed and any power net and rail in the netlist can be detected. At this point, the circuit can be partitioned into blocks connected at channels by cutting at any power net. With these net-partitioned blocks, a topological analysis can be performed to identify cuttable devices, un-cuttable devices, and synchronization requirements. Performing the topological analysis can include performing matrix abstraction to predict fill-in patterns and fill-reducing ordering. Performing the topological analysis can also include generating a gate model and a channel model for each partitioned MOSFET of each net-partitioned block.

After topological analysis, the circuit can then be re-partitioned into blocks connected at channels by cutting at any rail. A sparse solver can be applied to a sparse matrix representing the rail-partitioned blocks to identify potential partitions, but eliminating fill-ins as determined by the topological analysis. A cost function can be applied to the potential partitions as well as the identified cuttable and un-cuttable devices to determine final cut points in the circuit and dynamic inputs to the final blocks. Exemplary cost functions can include the available memory to perform simulation, the type of simulator to be used in the simulation, the specific data structures in the circuit, and/or the specific algorithms to be used in the simulation.

After the final cuts are determined, simulation can be performed on the final blocks and simulation results can be generated. Performing the simulation can include determining the input voltages for each block, determining the load currents and derivatives if the block has loads, solving for voltages and currents using the input voltages and any load currents and derivatives, exporting the voltages to any driven block, and calculating small signal, time-dependent derivatives for dynamic inputs if the block is a load block and passing those dynamic inputs to a driver block.

A method of performing simulation on a circuit including at least one non-ideal power source is also described. This method includes determining how the circuit would have been partitioned had the circuit included an ideal power source instead of the non-ideal power source. At this point, an order of potential partitions of the circuit can be determined using a sparse solver, but creating fill-ins as if the circuit included the ideal power source. Then, a cost function can be applied to the potential partitions to determine final partitions. The circuit can be simulated based on the final partitions. Simulation results can be generated based on this simulation.

The simulation can include providing the input voltages to each block. If the block has a load, then load currents and derivatives can be provided. The voltages and currents of the block can be solved using the input voltages and, where appropriate, the load currents and derivatives. These voltages can be exported to any driven block. If the block is a load block, then any small signal derivatives can be calculated for dynamic inputs to the block and such dynamic inputs can be passed to any driver block.

DETAILED DESCRIPTION OF THE FIGURES

Many circuits include a non-ideal voltage source. Partitioning these circuits using Fast-SPICE techniques frequently leads to very large partition sizes, and hence long simulation times. Specifically, because a non-ideal voltage source is affected by the current load from the circuits connected to that voltage source, the non-ideal voltage source and the circuits must be simulated as one block. Known techniques attempting to partition large circuits with non-ideal voltage sources require input from an engineer on designating partitioning nodes. Notably, even when successfully partitioned, the resulting sub-partitions (called blocks herein) must be synchronously evaluated, thereby negating, at least in part, the advantages of partitioning.

In accordance with one aspect of the invention, even strongly-connected blocks (i.e. those blocks in the presence of strong feed-forward) can be partitioned. When partitioned, each driver block (called a driver herein) looks like an ideal voltage source to a load block (called a load herein). If the driver looks like an ideal voltage source, then all blocks connected to that voltage source can be simulated independently and asynchronously.

To provide simulation accuracy, the load can be evaluated using its normal inputs (e.g. gates from other blocks) as well as its dynamic inputs (e.g. inputs from the driver). Moreover, the load can provide valuable feedback to the driver. This feedback can include indicating how much current the load is drawing as well as how much the current is changing with respect to voltage. In this manner, the driver knows (1) how much current the load is going to draw at the last bias and (2) if the driver voltage changes, then how much the load current correspondingly changes. This information can also be described as the current and its derivatives with respect to the driver voltage. Thus, although the driver can be cut from the load during partitioning, the effects of the load can be advantageously provided to the driver's port to ensure simulation accuracy.

In accordance with another aspect of the invention, a sparse matrix can be used to minimize fill-ins and automatically determine the final cuts for partitioning using a cost function. In general, a sparse matrix can be used to solve a very large system of equations (e.g. the sparse matrix having on the order of a million nodes). A sparse matrix is generally defined as a matrix that has few non-zero elements. To solve a matrix, the matrix is decomposed into an "L" and a "U" matrix, i.e. a lower triangular matrix and an upper triangular matrix (also called LU decomposition). Mathematically, L×U is equal to the original matrix. Advantageously, each triangular matrix can be easily inverted to solve equations.

Figure 1:
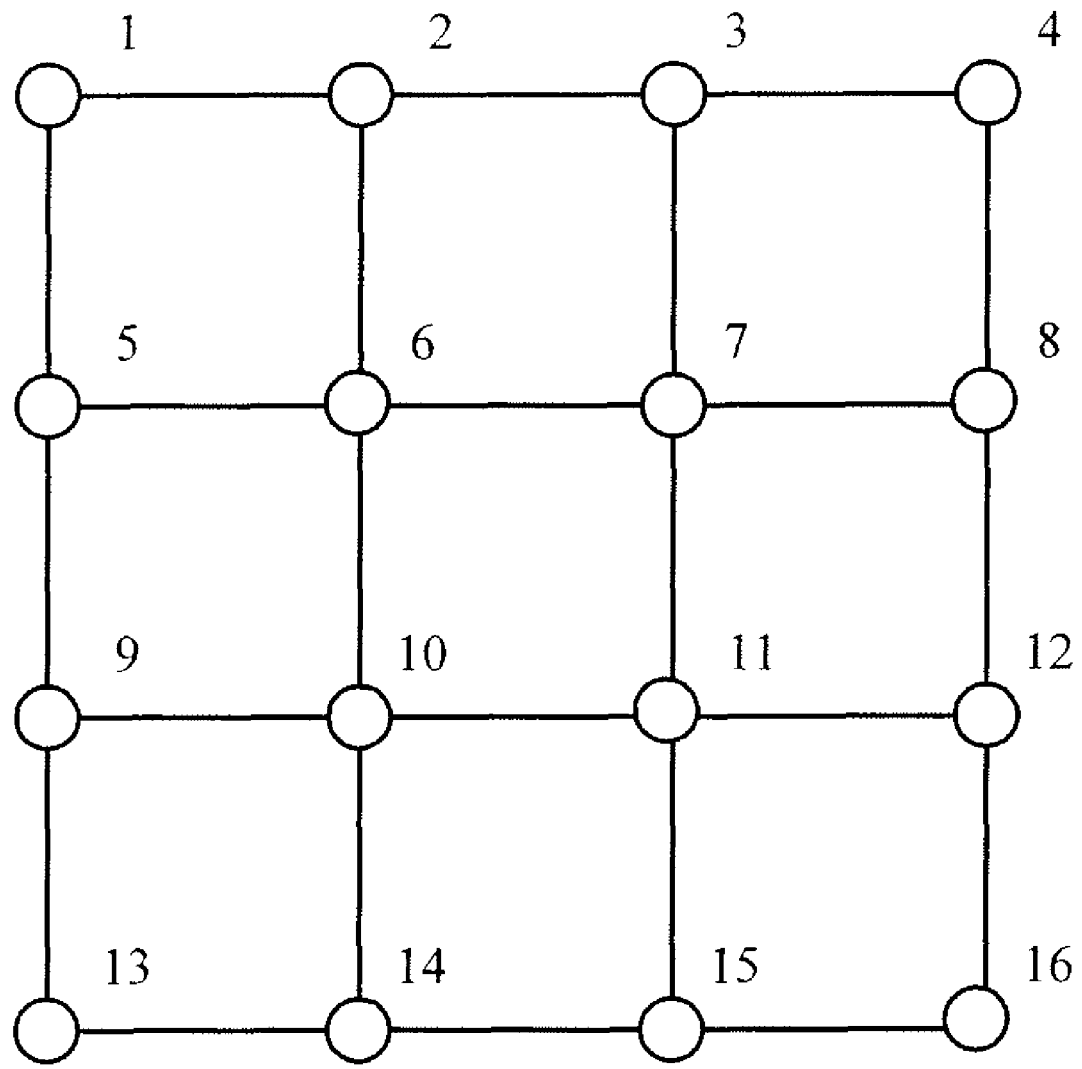
FIG. 1 illustrates a graph of a 3×3 matrix, wherein each node of the matrix represents a state variable in a mathematical matrix.

FIG. 1 illustrates a graph of a 3×3 matrix 100 having nodes 1-16, wherein each node represents a state variable in a mathematical matrix (note that matrix 100 is typically much larger for VLSI applications and does not have to be square). The "fill-in" of a matrix is any node that changes from zero to a non-zero value during the execution of an algorithm. As described in further detail below with respect to an exemplary circuit, the decomposing of a sparse matrix can be performed in a way that minimizes fill-ins, thereby simplifying subsequent simulation.

A sparse solver is a tool that can solve the sparse matrix. Note that the sparse solver can use any algorithm appropriate for the circuit topology to solve the sparse matrix as a static block. The solution can include (1) where the fill-ins occur and (2) the minimum fill-in ordering. At this point, a cost function can be applied to automatically determine the optimal cuts to the sparse matrix.

By automatically choosing the cut points in the matrix, representing the partitioned nodes with simplified linear models, ordering the solves of the sub-matrices, and detecting and exploiting latency where appropriate, the memory and time bottlenecks associated with Fast-SPICE are overcome while maintaining accuracy. For example, when signals inside a block are dormant (or latent, or not moving) and can be assumed to remain latent in the foreseeable future, then the block can be marked as "latent" and not solved for the duration of latency, thereby speeding up simulation considerably. Unlike prior technology, choosing cut points is intrinsically tied to a fill-reducing sparse solver algorithm. Specifically, by letting the sparse solver determine the cut point locations, the problems arising out of artificial means of choosing cut points (thereby unnecessarily increasing the total number of fill-ins) can be avoided. This technique will now be described in reference to FIG. 2.

Figure 2:
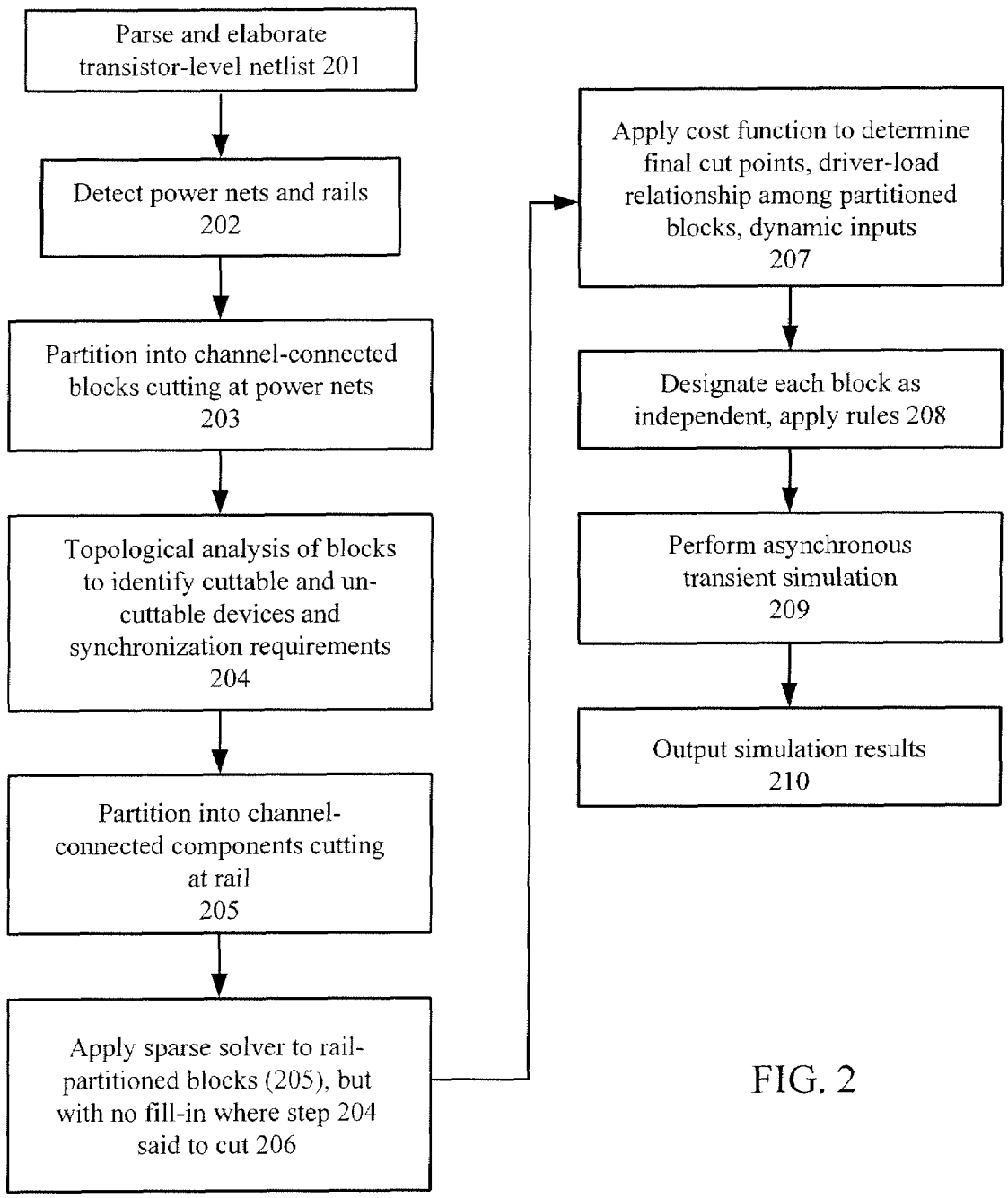
FIG. 2 illustrates a technique using a sparse solver to facilitate fast and accurate asynchronous simulation.

FIG. 2 illustrates a technique 200 using a sparse solver to facilitate fast and accurate asynchronous simulation. Step 201 can parse and elaborate a transistor-level netlist (e.g. a SPICE netlist), thereby determining what components are included in the netlist as well as the connections between all components. In step 202, power nets and rails can be detected. Note that the power nets can include ideal voltage sources, e.g. VDD and GND, but can also include non-ideal voltage sources. In one embodiment, a power net can be defined as any non-memory net with a significant number of channels connected to it (e.g. see power net VDD2 connected to the plurality of PMOS (p-type MOSFET) channels in FIG. 3A, described below). A rail can be defined as any set of nodes that are so close to an ideal voltage that it can be characterized as ideal (thus, a rail can be considered a subset of the power nets). In one embodiment, any standard rail detection technique can be used.

Figure 3A:
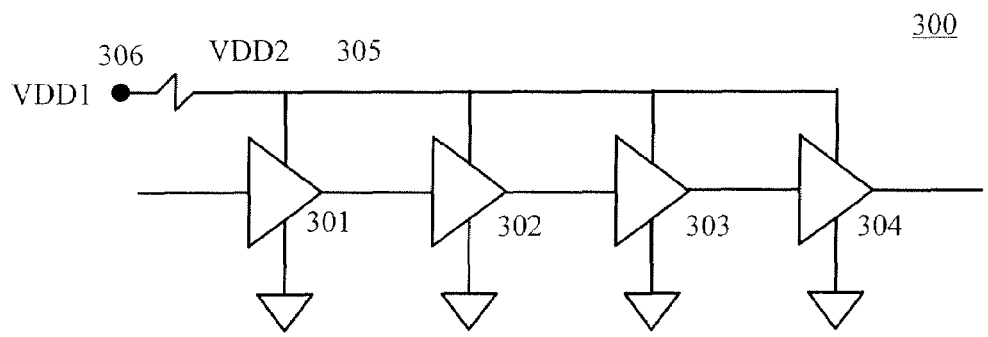
FIG. 3A illustrates an inverter chain circuit to exemplify some steps of the technique shown in FIG. 2.

FIG. 3A illustrates an inverter chain 300 to exemplify some steps of technique 200. Inverter chain 300 has four inverters 301-304 connected in series, each inverter being connected to ground GND as well being coupled to an ideal voltage source VDD1 via a resistor. For purposes of this example, assume that the resistor is large enough to transform the ideal voltage source VDD1 into a non-ideal voltage source VDD2 at node 305. Thus, in step 202, both VDD1 and VDD2 are identified as power nets whereas only VDD1 is identified as a rail. Note that ground is an ideal voltage source in inverter chain 300 and therefore can be partitioned from inverters 301-304. Thus, for simplification, ground is not shown in subsequent steps.

Each inverter (also called a node based on its relationship in a sparse matrix, described below) 301-304 in inverter chain 300 has two connections: one connection to its gate and another connection to the non-ideal voltage supply VDD2 at node 305 (node 306 being VDD1). Note that if the voltage supply VDD2 had been ideal, then the gates to the inverters could also be cut. In this manner, each node would only see a fill-in to VDD in the sparse matrix (the node would not see a fill-in to its fan-in or its fan-out). In accordance with one aspect of the invention, the sparse matrix that is set up for inverter chain 300 would not have fill-ins wherever cuts would have been made if it had been ideal. These applied heuristics ensure a fast simulation run time.

Figure 3B:
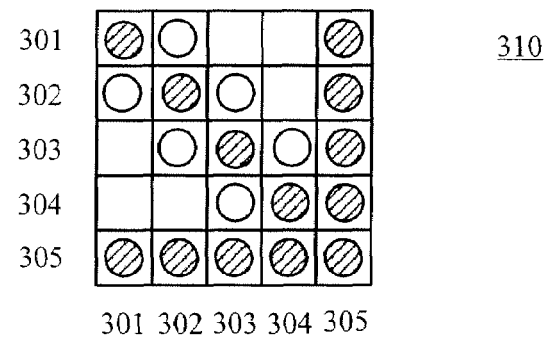
FIG. 3B illustrates an exemplary sparse matrix for the inverter chain shown in FIG. 3A.

FIG. 3B illustrates an exemplary sparse matrix 310 for inverter chain 300. Nodes 301-304 all have paths to node 305 (right column of circles with fill). Each node has a path to itself (the circles with fill on the diagonal). Node 305 has a path to each of nodes 301-304 (bottom row of circles with fill). Moreover, node 301 has a path to node 302 (and vice versa), node 302 has a path to node 303 (and vice versa), and node 303 has a path to node 304 (and vice versa) (all indicated by circles without fill). Although sparse matrix 310 does not appear to be "sparse", this is only because of the unusually small size of inverter chain 300. That is, the larger the inverter chain, the more sparse the matrix. Thus, for example, if an inverter chain has 50 nodes, then the corresponding sparse matrix would appear quite sparse.

Note that if node 305 had been an ideal voltage source, then node 301 would not have a path to node 302, because node 301 would have been cut. Thus, all circles without fill in sparse matrix 310 indicate fill-ins that would not have been present if node 305 had been an ideal voltage source. Ideally, to ensure fast simulation, sparse matrix 310 would not have any circles without fill.

Figure 3C:
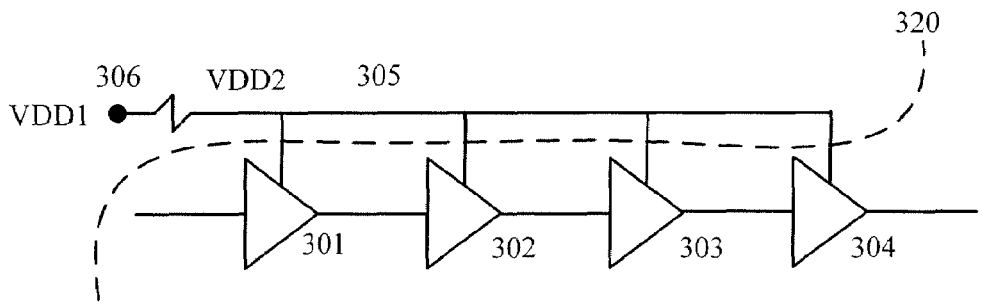
FIG. 3C illustrates how the inverter chain can be partitioned into channel-connected blocks at the power net.
Figure 3D:
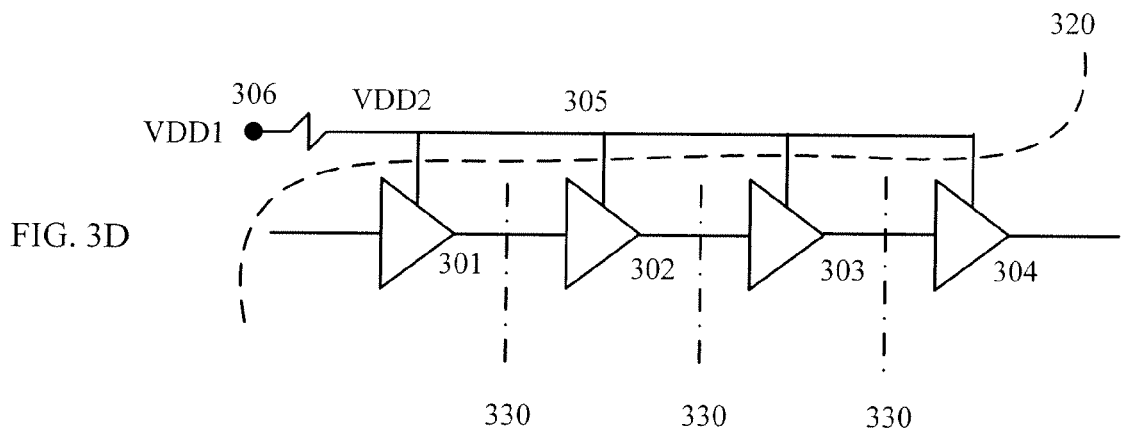
FIG. 3D illustrates how the inverters of the inverter chain can also be cut to form to separate blocks.

In accordance with one aspect of the invention, the same rules that would have been applied to ideal voltage source VDD1 are applied to inverter chain 300, which has a non-ideal voltage source VDD2. Thus, referring back to FIG. 2, step 203 partitions the circuit into channel-connected blocks (i.e. strongly-connected blocks) at the power nets as if the power nets were ideal voltage sources (that is, as if the power nets were rails). For example, in the case of inverter chain 300 and referring to FIG. 3C, nodes 301-304 can be cut from the non-ideal voltage source VDD2 at node 305, as indicated by dashed line 320. Additionally, and referring to FIG. 3D, nodes 301-304 can be cut from each other, as indicated by dash-dot lines 330. Thus, in step 203, VDD1 and VDD2 are evaluated as a power block and each node 301-304 is evaluated in a separate block.

Then, step 204 can consider both the topological analysis and the matrix abstraction of the circuit. The topological analysis can identify devices in the circuit which, when cut at certain terminals, will not cause unacceptable inaccuracies in the solution. The topological analysis also allows the automatic identification of circuit elements that need to be solved synchronously (e.g. components such as ring-oscillators, current mirrors, differential pairs, latches, source-coupled pairs, and any other very high gain/very high accuracy elements) and therefore cannot be cut. Moreover, the topological analysis can identify the devices that need full integration and those that can be integrated semi-implicitly. For example, devices that have exponential current-voltage relationships may always need full integration. Latches, ring-oscillators, and sensitive analog-type circuit parts may also need full integration to meet accuracy targets.

The matrix abstraction can perform symbolic factorization to predict the fill-in pattern of the factorized matrix if it were to be solved as a single system. Fill-reducing ordering of the nodes is obtained from this factorization. In one embodiment, minimum degree and minimum elimination tree height algorithms can be used. In other embodiments, other symbolic factorization methods, such as nested dissection, could be equivalently used.

In inverter chain 300, step 204 can determine that each of the nodes 301-304 can be cut without causing unacceptable inaccuracies in the solution. That is, the cuts made in step 203 (specifically the cuts indicated by lines 330) are appropriate, thereby allowing each node 301-304 to be evaluated as a separate block. Additionally, step 204 can generate multiple models for each device node. For example, in the case of inverter chain 300, step 204 can generate a gate model and a channel model for each of nodes 301-304.

Figure 3E:
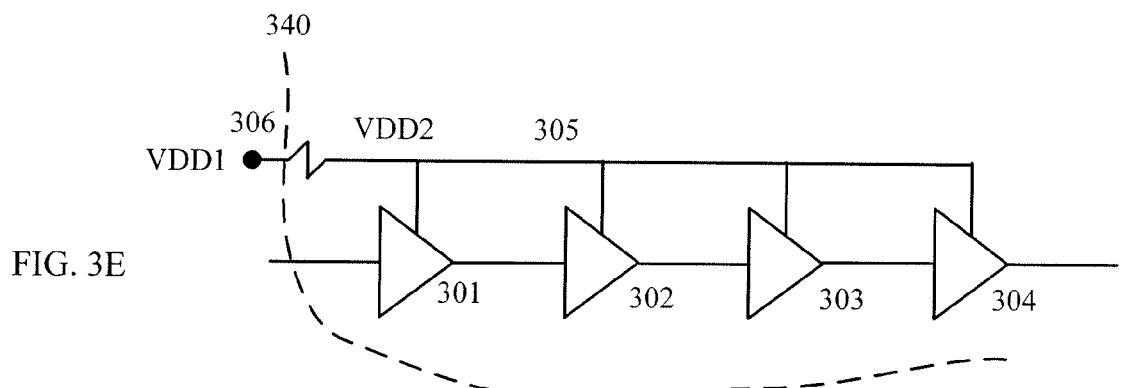
FIG. 3E illustrates how the inverter chain can be partitioned into channel-connected blocks at the power rail.

Step 205 can partition the circuit into channel-connected components cut at the rails, instead of the power nets. Thus, referring back to inverter chain 300 and referring to FIG. 3E, step 205 would cut at the power rail VDD1, i.e. node 306, thereby allowing nodes 301-305 (the inverters and the non-ideal voltage VDD2) to be evaluated in one block.

Figure 3F:
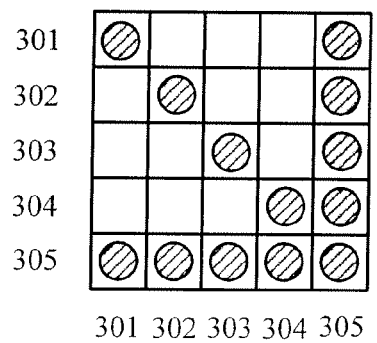
FIG. 3F illustrates a resulting sparse matrix after applying a sparse solver to the rail-partitioned blocks, but with no fill-ins where topological analysis said to cut.

Then, step 206 applies a sparse solver to the rail-partitioned blocks of step 205, but with no fill-in where the topological analysis of step 204 said to cut. Thus, in the case of inverter chain 300, FIG. 3F illustrates the resulting sparse matrix 310' provided to the sparse solver in step 206. Note that any sparse solver uses graph theory internally to analyze fill-in.

Figure 3G:
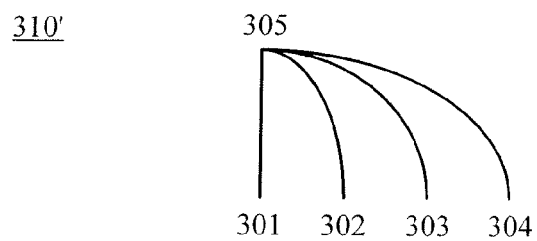
FIG. 3G illustrates a fill-in graph representing the resulting sparse matrix shown in FIG. 3F.

FIG. 3G illustrates a fill-in graph representing sparse matrix 310'. In this fill-in graph, the vertices represent nodes in the netlist (e.g. inverters, power nets, other low-level components, etc.) and an edge represents a non-zero fill-in between the nodes. This fill-in graph is a directed acyclic graph where the direction of edges implies the order of elimination chosen by the symbolic factorization algorithm. As the edges are shown in FIG. 3G, nodes 301, 302, 303, 304, and 305 would be solved in that order. Thus, the last node eliminated (in this case, node 305) is the vertex with no incoming edges. In one embodiment, a mapping between nodes in the circuit and nets (groups of nodes connected by low resistance DC paths) can be maintained alongside the fill-in graph for reference.

Thus, in general, step 206 can traverse the fill-in graph to identify clusters of vertices that have sets of incoming edges from the same sets of nodes or nets. These clusters can be marked as potential sub-partitions. This marking can advantageously result in an implicit hierarchy within a large partitioned region. Moreover, this marking can advantageously identify any series of digital or analog logic circuits driven by internal power-supply nets. Because both nodes and nets are considered for identification of cuttable vertices, technique 200 can be used for a whole range of designs, i.e. from pre-layout hierarchical designs to post-layout flat designs.

Step 207 then simultaneously considers and applies a cost function to the potential partitions identified from the sparse matrix in step 206 and the potential cuttable and un-cuttable devices identified topologically in step 204 to arrive at the final accepted cut points in the netlist. Exemplary cost functions can include, but are not limited to, available memory, the type of simulator to be used, specific data structures in the circuit, and specific algorithms (e.g. Fast-SPICE) to be used in simulation.

A simple cost function is one which tends to maximize the number of blocks that have identical topologies and have identical inputs. This cost function would typically be able to cut an array of memory cells in such a way that each cell forms a block. Cells in a column of, for example, a static random-access memory (SRAM) will have the same inputs (the bit lines and the power supply nodes) while the cells are identical (or close to identical) to each other. Another simple cost function could be such that it breaks up a big block into two approximate halves (comparing the number of nodes in each sub-block) while not allowing larger than a certain number of inputs created by the partition.

In one embodiment, topological sorting and transitive reduction can be performed on the fill-in graph to automatically output an ordering of the resulting blocks. Note that once a cut is determined, then the element given first is the "load" and the element given last is the "driver", i.e. a driver-load relationship is determined. In the case of inverter chain 300, nodes 301-304 can be cut from node 305, i.e. VDD2, and a dynamic input can be provided for each of nodes 301-304.

Step 208 can designate each block as independent, i.e. each block can be simulated asynchronously. Note that any conventional rules, e.g. the Fast-SPICE rules, can be applied at this time. Step 209 performs the asynchronous transient simulation based on the order determined by step 207. In one embodiment, the solution method at a time-point involves accessing the voltages of the inputs to the block from the unique driver block of the block and the sum of the port models of its load blocks. After solving at a time-point, a linear multi-port model of the input-port behavior of the block is updated such that the driver of this block can access the latest model values of this load when it is solved. Step 210 outputs the simulation results.

Figure 4:
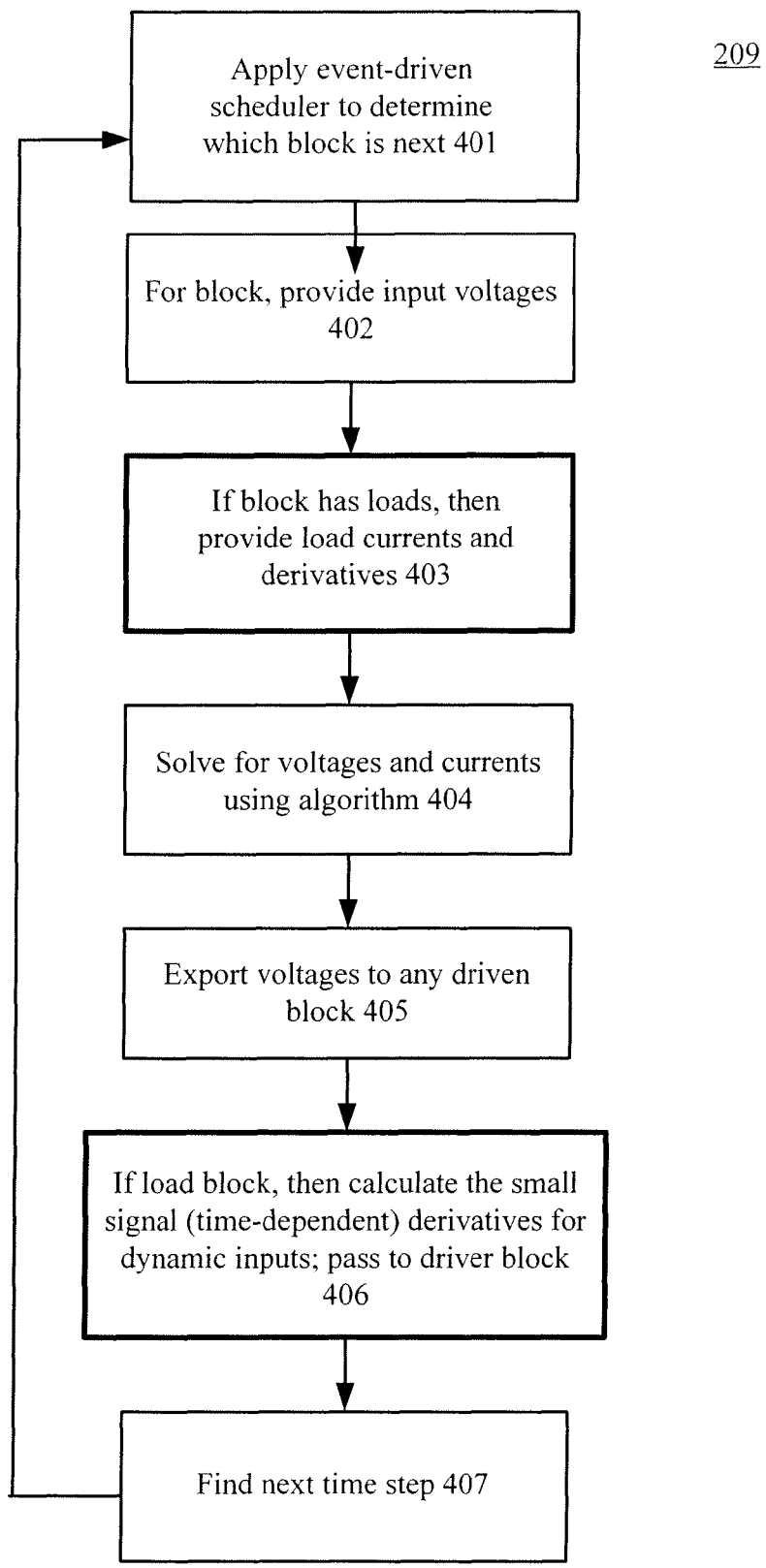
FIG. 4 illustrates an exemplary technique to perform an asynchronous transient simulation.

FIG. 4 illustrates an exemplary technique to perform the asynchronous transient simulation 209 (FIG. 2). In step 401, an event-driven scheduler (a standard Fast-SPICE tool) can be applied to determine which block is next. Step 402 can determine the input voltages for that block. Additionally, if the block has loads, then step 403 can also provide the load currents and derivatives to the block. Using the input voltage values and, if appropriate, the load currents and derivatives, step 404 can solve for voltages and currents of the block using, for example, a Fast-SPICE algorithm. Step 405 can export the resulting voltages to any driven block. In contrast, for a load block, step 406 can calculate the small signal (time-dependent) derivatives for dynamic inputs and pass those calculated values to any driver block. Step 407 can determine the next time step, if any, and return to step 401 (if a next time step is needed).

In summary, the above-described automatic partitioning of VLSI circuits allows substantially asynchronous simulation of the partitioned blocks with minimal reduction in accuracy. This technique can determine potentially cuttable and un-cuttable devices as well as synchronous and asynchronous groups among the partitioned blocks by using a topological analysis. The blocks can be ordered by using driver-load relationships and reducing the fill-in of the sparse matrix. A load block can be represented at its input port(s) by using a multi-port current-conductance model, a current-conductance-capacitance model, or another linear time-dependent model. The partitioning method can advantageously provide consistent results on both flat and hierarchical netlists.

Figure 5:
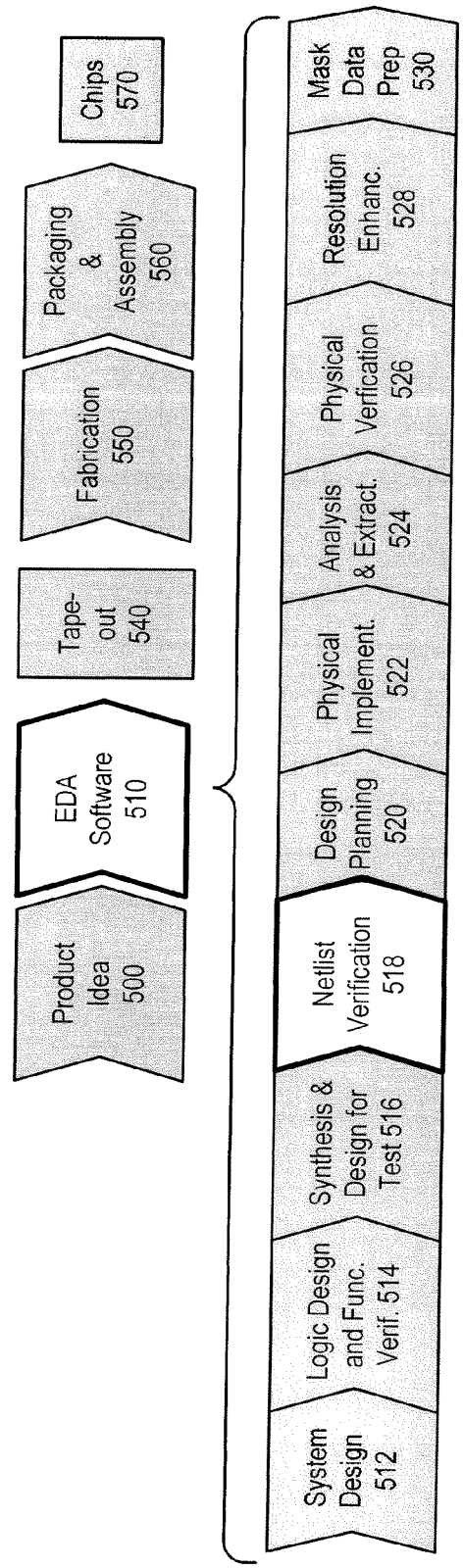
FIG. 5 shows a simplified representation of a digital ASIC design flow including the automated partitioning technique.

To place this automatic partitioning in context, FIG. 5 shows a simplified representation of an exemplary digital ASIC design flow. At a high level, the process starts with the product idea (step 500) and is realized in an EDA software design process (step 510). When the design is finalized, it can be taped-out (event 540). After tape out, the fabrication process (step 550) and packaging and assembly processes (step 560) occur resulting, ultimately, in finished chips (result 570).

The EDA software design process (step 510) is actually composed of a number of steps 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 510) will now be provided:

System design (step 512): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 514): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 518): At this step, the netlist is checked for compliance with timing constraints and for correspondence with the VHDL/Verilog source code. Exemplary EDA software products from Synopsys, Inc. that can be used at this step include Formality, PrimeTime, and VCS products. The automatic partitioning technique described above can be included in the tools providing netlist verification.

Design planning (step 520): Here, an overall floorplan for the chip is constructed and analyzed for timing and top-level routing. Exemplary EDA software products from Synopsys, Inc. that can be used at this step include Astro and IC Compiler products.

Physical implementation (step 522): The placement (positioning of circuit elements) and routing (connection of the same) occurs at this step. Exemplary EDA software products from Synopsys, Inc. that can be used at this step include the Astro and IC Compiler products.

Analysis and extraction (step 524): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 526): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 528): This step involves geometric manipulations of the layout to improve manufacturability of the design. Exemplary EDA software products from Synopsys, Inc. that can be used at this step include Proteus, ProteusAF, and PSMGen products.

Mask data preparation (step 530): This step provides the "tape-out" data for production of masks for lithographic use to produce finished chips. Exemplary EDA software products from Synopsys, Inc. that can be used at this step include the CATS® family of products.

The automatic partitioning technique can be stored in a computer program product tangibly embodied in a machine-readable storage device for execution by a programmable processor. The programmable processor can execute a program of instructions to perform the functions described in FIG. 2 by operating on input data and generating output data.

Specifically, this computer program (which could include multiple programs therein) can execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired. In any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files (e.g. magnetic disks, such as internal hard disks and removable disks, magneto-optical disks, and optical disks). Storage devices suitable for tangibly embodying computer program instructions and data include all forms of non-volatile memory, including, for example, semiconductor memory devices (e.g. EPROM, EEPROM, or flash memory devices) or disks (e.g. internal hard disks and removable disks, magneto-optical disks, and CDROM disks). Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. They are not intended to be exhaustive or to limit the invention to the precise forms disclosed. Accordingly, it is intended that the scope of the invention be defined by the following Claims and their equivalents.

The invention claimed is:

1. A method of providing simulation results, the method comprising:
   parsing a netlist of a circuit;
   detecting any power net and rail in the netlist;
   partitioning the circuit into net-partitioned blocks connected at channels by cutting at any power net;
   performing a topological analysis of the net-partitioned blocks to identify cuttable devices, un-cuttable devices, and synchronization requirements;
   re-partitioning the circuit into rail-partitioned blocks connected at channels by cutting at any rail;
   applying a sparse solver to a sparse matrix representing the rail-partitioned blocks to identify potential partitions, the sparse matrix eliminating fill-ins as determined by performing topological analysis;
   applying a cost function to the potential partitions as well as the identified cuttable and un-cuttable devices to determine final cut points in the circuit and dynamic inputs to final blocks, wherein the cost function includes at least one of available memory to perform simulation, a type of simulator to perform the simulation, specific data structures in the circuit, and specific algorithms to be used in the simulation;
   performing simulation on the final blocks using the dynamic inputs; and
   outputting simulation results.

2. The method of claim 1, wherein performing simulation includes computing the dynamic inputs.

3. The method of claim 2, wherein computing the dynamic inputs includes determining a time-dependent, small signal equivalent of a load at a last bias.

4. The method of claim 1, wherein performing simulation includes for each block:
   determining input voltages for the block;
   determining load currents and derivatives if the block has loads;

solving for voltages and currents using the input voltages and any load currents and derivatives;

exporting the voltages to any driven block; and calculating small signal, time-dependent derivatives for dynamic inputs if the block is a load block and passing the dynamic inputs to a driver block.

5. The method of claim 1, wherein performing the topological analysis includes performing matrix abstraction to predict fill-in patterns and fill-reducing ordering.

6. The method of claim 1, wherein performing the topological analysis includes generating a gate model and a channel model for each partitioned MOSFET of each net-partitioned block.

7. A method of performing simulation on a circuit, the method comprising:

using a sparse matrix algorithm to a sparse matrix representing rail-partitioned blocks to automatically determine potential partitions to the circuit the sparse matrix eliminating fill-ins during topological analysis;

using a cost function and the potential partitions as well as cuttable and un-cuttable devices to determine final partitions to the circuit, wherein the cost function includes at least one of available memory to perform simulation, a type of simulator to perform the simulation, specific data structures in the circuit, and specific algorithms to be used in the simulation;

simulating the circuit with the final partitions; and outputting results of the simulation.

* * * * *

UNITED STATES PATENT AND TRADEMARK OFFICE
CERTIFICATE OF CORRECTION

PATENT NO.         : 8,060,355 B2                                      Page 1 of 1
APPLICATION NO.    : 11/829844
DATED              : November 15, 2011
INVENTOR(S)        : Kevin J. Kerns et al.

It is certified that error appears in the above-identified patent and that said Letters Patent is hereby corrected as shown below:

On the title page, item (56) References Cited, U.S. PATENT DOCUMENTS, 2$^{nd}$ line, amend "Deng et al." to --Tcherniaev et al.--.

In the Claims

<u>Column 10</u>
Line 46, insert --the-- before "topological".
Line 55, insert --the-- before "simulation".
Line 57, insert --the-- before "simulation".
Line 58, insert --the-- before "performing".
Line 58, insert --the-- before "simulation".
Line 63, insert --the-- before "performing".
Line 63, insert --the-- before "simulation".

<u>Column 11</u>
Line 5, insert --the-- before "dynamic".

<u>Column 12</u>
Line 3, insert a --,-- after "circuit".
Line 8, insert --the-- before "simulation".

Signed and Sealed this
Tenth Day of December, 2013

Margaret A. Focarino
*Commissioner for Patents of the United States Patent and Trademark Office*